(12) United States Patent
Suzuki

(10) Patent No.: US 11,592,868 B2
(45) Date of Patent: Feb. 28, 2023

(54) PUSH SWITCH INCLUDING VIBRATOR

(71) Applicant: ALPS ALPINE CO., LTD., Tokyo (JP)

(72) Inventor: Katsutoshi Suzuki, Tokyo (JP)

(73) Assignee: ALPS ALPINE CO., LTD., Tokyo (JP)

(*) Notice: Subject to any disclaimer, the term of this patent is extended or adjusted under 35 U.S.C. 154(b) by 198 days.

(21) Appl. No.: 17/083,527

(22) Filed: Oct. 29, 2020

(65) Prior Publication Data

US 2021/0041914 A1 Feb. 11, 2021

Related U.S. Application Data

(63) Continuation of application No. PCT/JP2019/018979, filed on May 13, 2019.

(30) Foreign Application Priority Data

May 23, 2018 (JP) .............................. JP2018-098721

(51) Int. Cl.
*H01H 13/14* (2006.01)
*H01H 13/04* (2006.01)
*H03K 17/97* (2006.01)
*G06F 1/16* (2006.01)

(52) U.S. Cl.
CPC .......... *G06F 1/1626* (2013.01); *H01H 13/04* (2013.01); *H01H 13/14* (2013.01); *H03K 17/97* (2013.01)

(58) Field of Classification Search
CPC ....... G06F 1/1626; G06F 3/016; H01H 13/04; H01H 13/14; H01H 13/85; H01H 2003/008; H01H 2215/05; H03K 17/97
See application file for complete search history.

(56) References Cited

U.S. PATENT DOCUMENTS

| 6,747,631 | B1 | 6/2004 | Sakamaki et al. |
| 8,217,742 | B2* | 7/2012 | Trudeau ................. G01D 5/244 335/206 |
| 9,423,894 | B2* | 8/2016 | Olsson .................. G06F 3/0338 |
| 9,898,033 | B1* | 2/2018 | Long ..................... G01D 5/145 |
| 10,019,031 | B2 | 7/2018 | Hu |
| 10,042,437 | B2* | 8/2018 | Hisatsugu ........... G06F 3/03548 |

(Continued)

FOREIGN PATENT DOCUMENTS

| DE | 102007058110 | 6/2009 |
| JP | H01-243325 | 9/1989 |

(Continued)

OTHER PUBLICATIONS

International Search Report for PCT/JP2019/018979 dated Jul. 30, 2019.

*Primary Examiner* — Bernard Rojas
(74) *Attorney, Agent, or Firm* — IPUSA, PLLC

(57) ABSTRACT

A push switch includes an operating part configured to be pressed in a first direction, an elastic holding member configured to hold the operating part such that the operating part can vibrate in a second direction orthogonal to the first direction, a frame member configured to hold the elastic holding member such that the elastic holding member can vibrate in the second direction, and a vibrator configured to generate a vibration in the second direction, the vibrator being provided in the elastic holding member.

10 Claims, 15 Drawing Sheets

(56) References Cited

U.S. PATENT DOCUMENTS

2003/0034954 A1 2/2003 Sakamaki et al.
2013/0154972 A1 6/2013 Takeuchi

FOREIGN PATENT DOCUMENTS

| JP | 2000-330688 | 11/2000 |
| JP | 2003-057062 | 2/2003 |
| JP | 2013-127687 | 6/2013 |
| JP | 2015-165474 | 9/2015 |
| JP | 2017-063030 | 3/2017 |

* cited by examiner

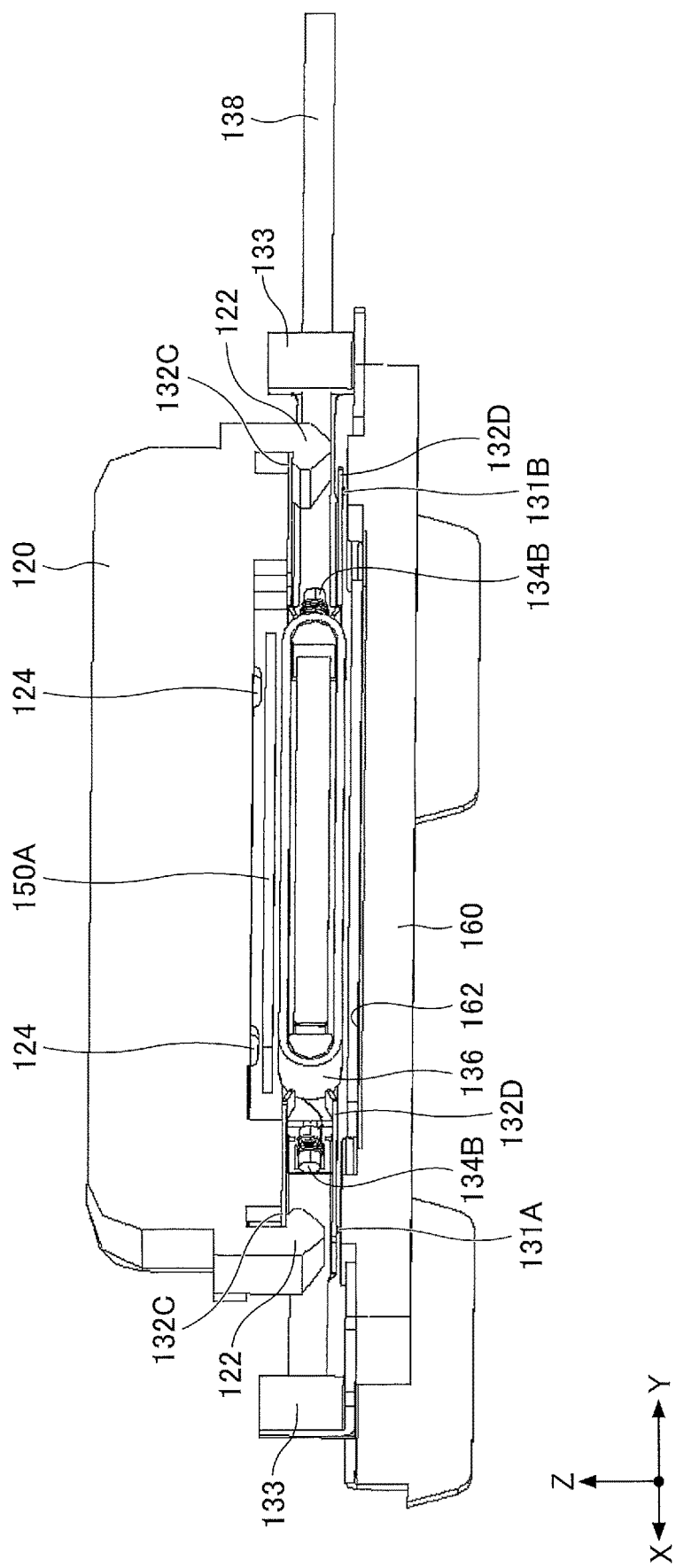

PUSH SWITCH INCLUDING VIBRATOR

CROSS-REFERENCE TO RELATED APPLICATION

This application is a continuation application of International Application No. PCT/JP2019/018979 filed on May 13, 2019, and designated the U.S., which is based upon and claims priority to Japanese Patent Application No. 2018-098721, filed on May 23, 2018, the entire contents of which are incorporated herein by reference.

BACKGROUND OF THE INVENTION

1. Field of the Invention

The present disclosure relates to a push switch.

2. Description of the Related Art

In an operating device used in various electronic devices, techniques that can present a tactile sensation to an operator have been known.

For example, Patent Document 1 describes a technique of vibrating a touch sensor, in a tactile sensation providing device configured to be operated by a contact applied to an operation surface, for detecting a contact position on the operation surface in a horizontal direction with respect to the operation surface.

Patent Document 2 describes a technique of applying an impact to a press member by, when a user pushes the press member in a first direction in a button mechanism provided by the electronic device, moving a moving member in a second direction opposite to the first direction.

RELATED-ART DOCUMENTS

Patent Document

Patent Document 1: Japanese Laid-Open Patent Publication No. 2013-127687
Patent Document 2: Japanese Laid-Open Patent Publication No. 2017-063030

SUMMARY OF THE INVENTION

According to one aspect of the embodiment of the present disclosure, a push switch includes an operating part configured to be pressed in a first direction, an elastic holding member configured to hold the operating part such that the operating part can vibrate in a second direction orthogonal to the first direction, a frame member configured to hold the elastic holding member such that the elastic holding member can vibrate in the second direction, and a vibrator configured to generate a vibration in the second direction, the vibrator being provided in the elastic holding member.

BRIEF DESCRIPTION OF THE DRAWINGS

FIG. 13 is a cross-sectional view of the push switch according to the embodiment taken along the YZ plane.

DESCRIPTION OF THE PREFERRED EMBODIMENTS

Figure 1:
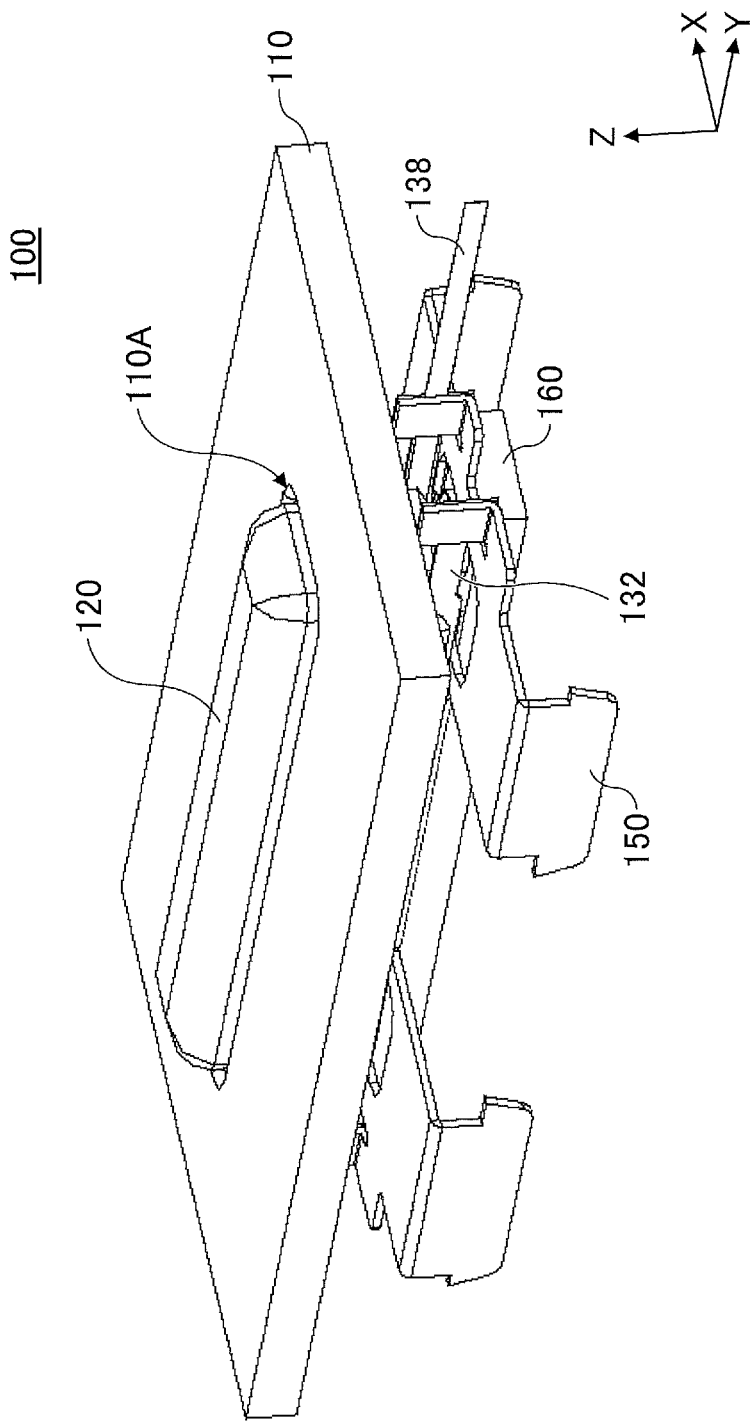
FIG. 1 is a perspective view of an external appearance of a push switch according to an embodiment.

In the related art, in a push switch including an operating part configured to be pressed, various tactile sensations cannot be efficiently presented to an operator pressing the operating part. Therefore, with a relatively simple configuration, a push switch that can efficiently present various tactile sensations to an operator pressing the operating part is desired.

According to at least one embodiment, with a relatively simple configuration, a push switch that can efficiently present various tactile sensations to an operator pressing the operating part can be achieved.

In the following, with reference to the drawings, an embodiment will be described. For convenience, the following description assumes that the Z-axis direction in the drawings is the up and down direction, the X-axis direction in the drawings is the front and rear direction, and the Y-axis direction in the drawings is the left right direction.

(Overview of a Push Switch 100)

Figure 2:
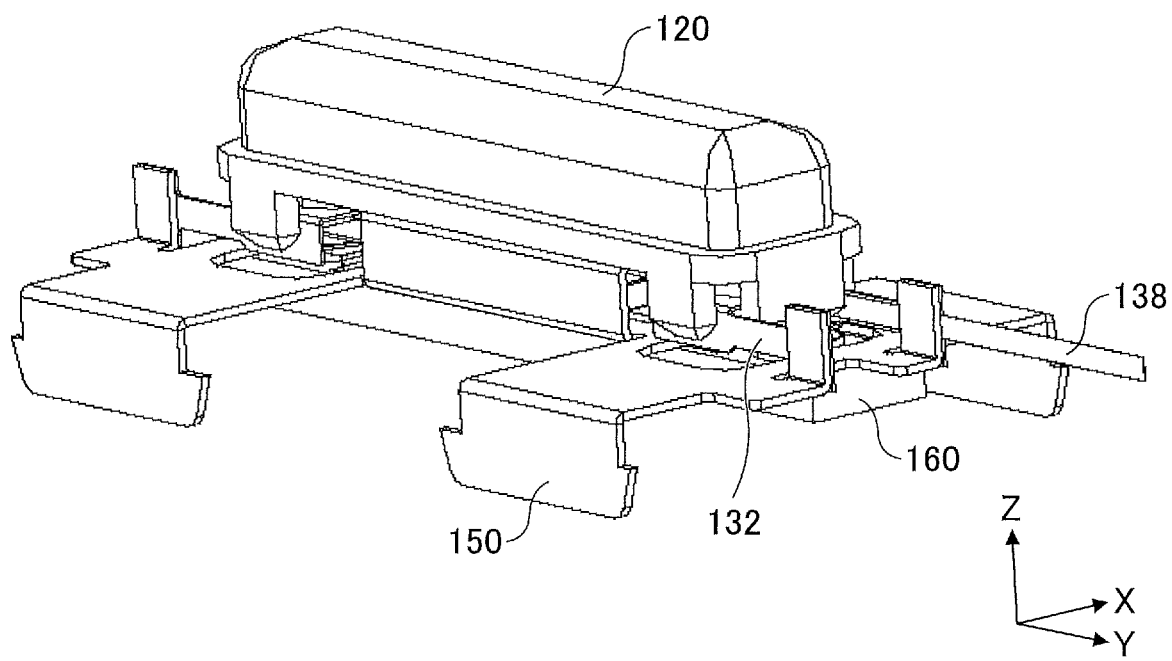
FIG. 2 is a perspective view of an external appearance of the push switch according to the embodiment.
Figure 3:
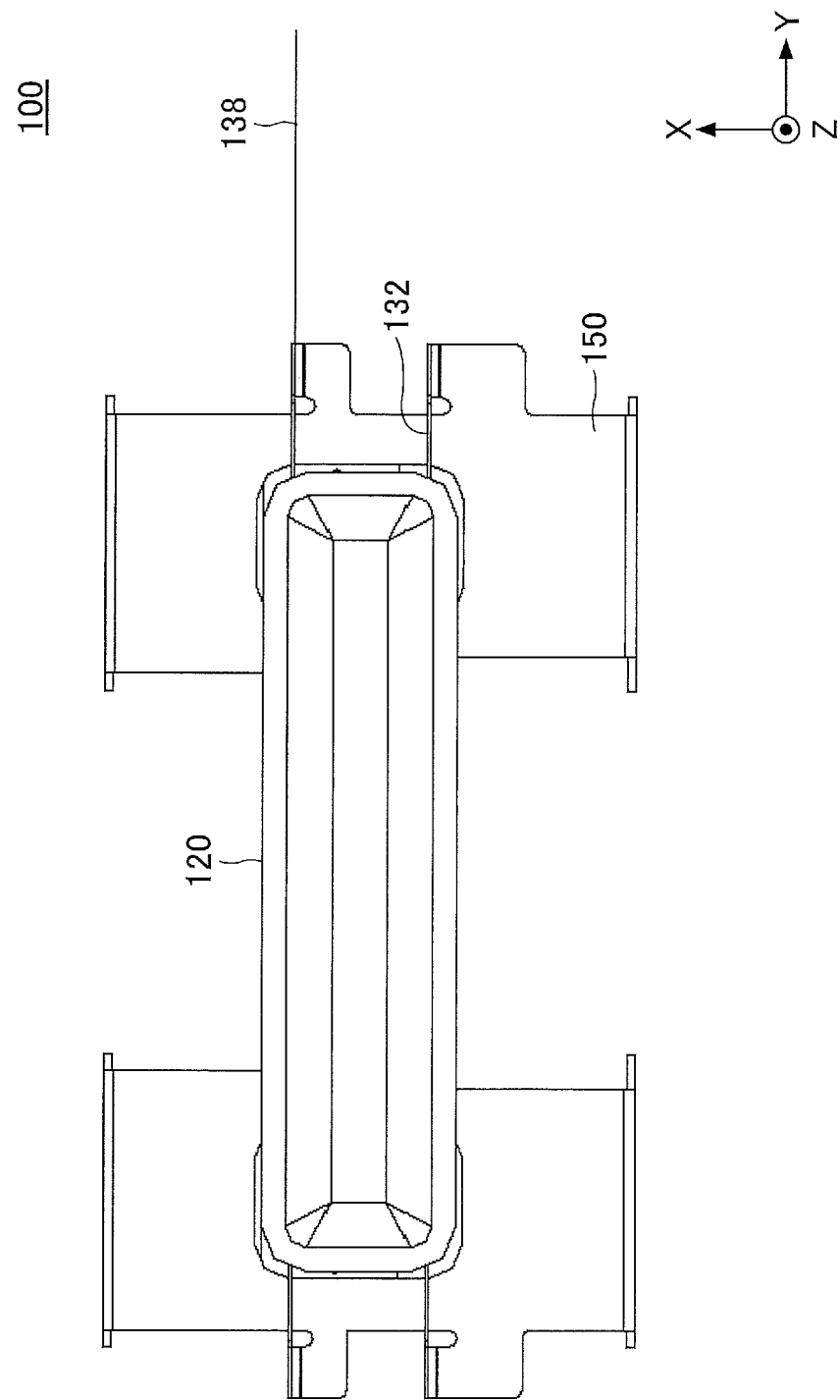
FIG. 3 is a front view of the push switch according to the embodiment.
Figure 4:
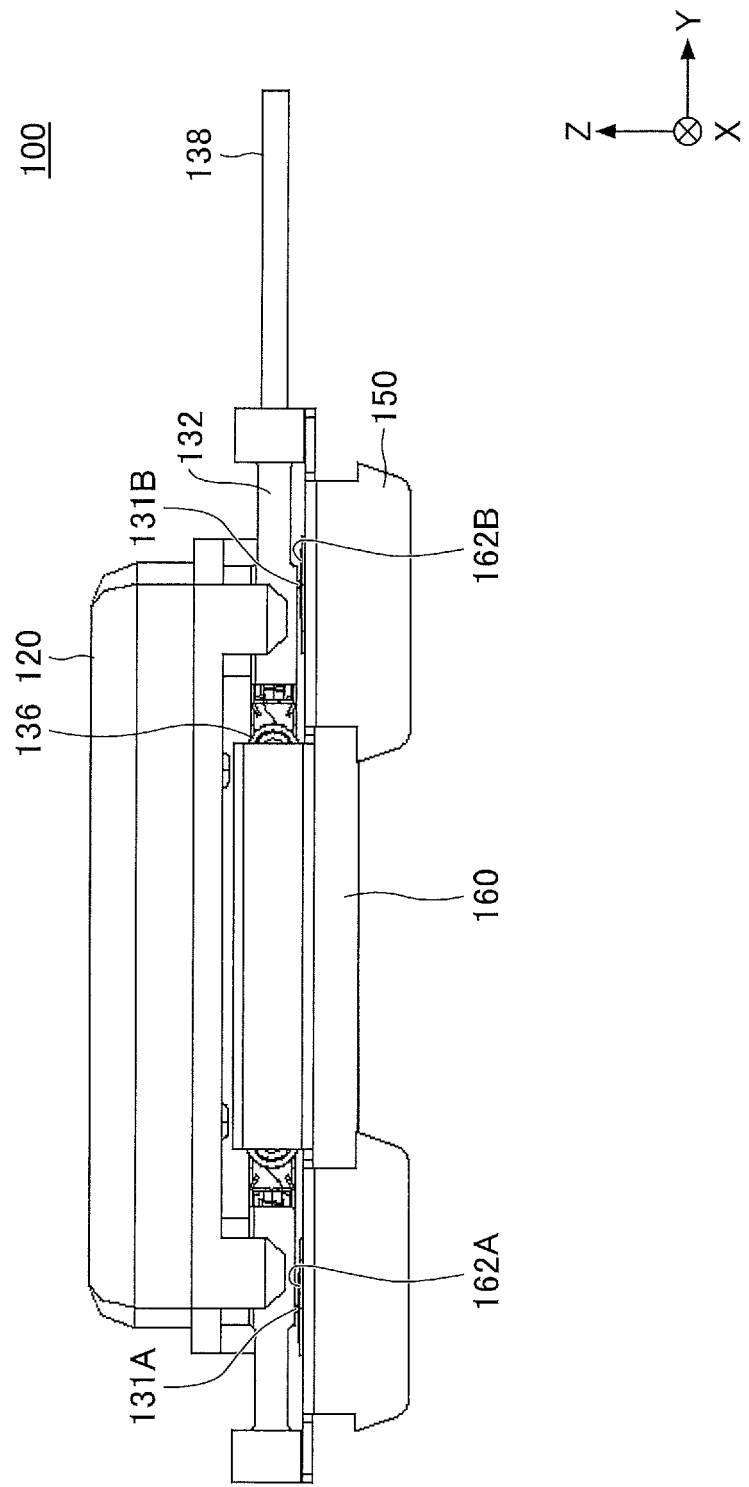
FIG. 4 is a front view of the push switch according to the embodiment.
Figure 5:
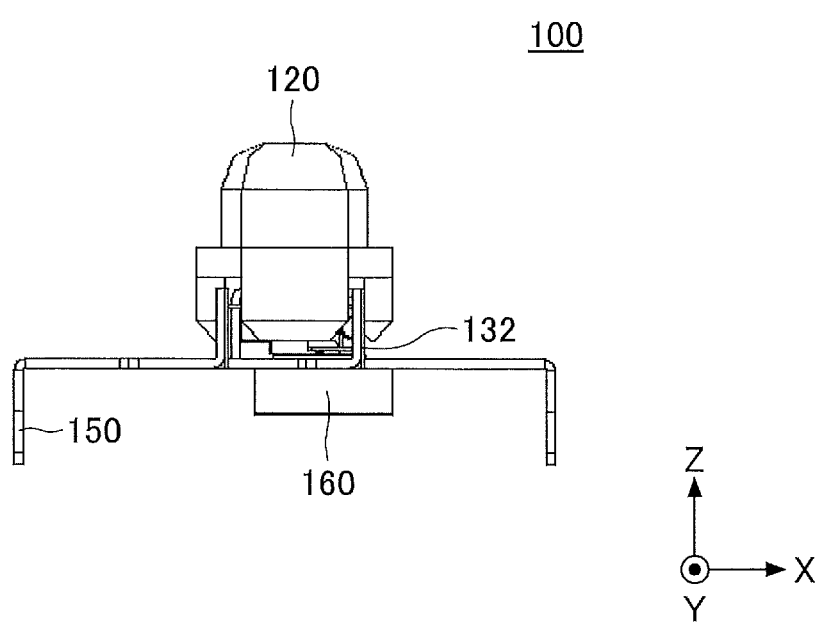
FIG. 5 is a side view of the push switch according to the embodiment.

FIG. 1 and FIG. 2 are perspective views of the external appearance of a push switch 100 according to the embodiment. FIG. 3 is a top view of the push switch 100 according to the embodiment. FIG. 4 is a front view of the push switch 100 according to the embodiment. FIG. 5 is a side view of the push switch 100 according to the embodiment.

In FIG. 1, with respect to a housing 110, a portion of the housing 110 (i.e., a flat plate upper surface in which an opening 110A is formed) is illustrated. As an entire shape of the housing 110, various shapes may be adopted depending on an electronic device in which the push switch 100 is installed, an installation location of the push switch 100, and the like. In FIGS. 2 to 5, the push switch 100 in a state in which the housing 110 is removed is illustrated.

The push switch 100 illustrated in FIG. 1 is a switch used in various electronic devices. For example, the push switch 100 may be provided on a console panel inside an automobile and used as a switch to switch between on and off states in an electronic device mounted in the automobile.

As illustrated in FIG. 1, the push switch 100 includes the housing 110 and a push button 120. The push button 120 is configured to be pressed and protrudes above the opening 110A formed on the upper surface of the housing 110. The push switch 100 can switch from the off state to the on state by pushing the push button 120 downward (i.e., the Z-axis negative direction in the drawing and an example of a "first direction").

Specifically, in the push switch 100, the push button 120 is attached to the top of an elastic holding member 132. On a bottom surface of the elastic holding member 132, a first movable contact 131A and a second movable contact 131B (see FIG. 4) are provided. A bracket 160 is provided under the elastic holding member 132. On an upper surface of the bracket 160, flexible printed circuits (FPC) 162 is provided. The FPC 162 includes a first fixed contact 162A and a second fixed contact 162B (see FIG. 4). The first fixed contact 162A is provided at a position facing the first movable contact 131A. The second fixed contact 162B is provided at a position facing the second movable contact 131B.

In the push switch 100 configured in such a manner, in a state in which the push button 120 is not pressed, the first movable contact 131A is separate from the first fixed contact 162A and the second movable contact 131B is separate from the second fixed contact 162B. Thus, the first fixed contact 162A and the second fixed contact 162B are in a non-conducting state, that is, the push switch 100 is in the off state.

When the push button 120 is pressed, pressing pressure from the push button 120 causes the elastic holding member 132 to bend downward. Thus, the first movable contact 131A contacts the first fixed contact 162A and the second movable contact 131B contacts the second fixed contact 162B. As a result, the first fixed contact 162A and the second fixed contact 162B are electrically coupled to each other via the elastic holding member 132, and the push switch 100 is in the on state.

When the push switch 100 is released from a state in which the push button 120 is pressed, an elastic return force of the elastic holding member 132 removes downward bend of the elastic holding member 132. As a result, the first fixed contact 162A and the second fixed contact 162B are in the non-conducting state again, and the push switch 100 automatically returns to the off state.

Additionally, the push switch 100 is configured to vibrate the push button 120 in the front and rear direction (i.e., the X-axis direction in the drawing and an example of a "second direction"). Specifically, in the elastic holding member 132, a coil 136 (see FIG. 4) is provided as an example of a "vibrator". The coil 136 is energized by an external controller (which is not illustrated) through an FPC 138 to vibrate in a front and back direction while elastically deforming the elastic holding member 132. This causes the push button 120 attached to the elastic holding member 132 to vibrate in the front and rear direction.

For example, when an external controller detects that the push button 120 is pressed by an operator's finger and the push switch 100 is switched to the on state, the alternating current is supplied to the coil 136 to cause the coil 136 to vibrate in the front and rear direction. This enables the push switch 100 to present a tactile sensation to the operator's finger by vibrating the push button 120 in the front and rear direction. As a result, the operator can tactilely recognize that the push switch 100 has been switched to the on state.

The push switch 100 can control the vibration frequency, the amplitude, the vibration timing, the vibration period, and the like of the coil 136 by controlling the alternating current supplied for vibrating the coil 136 from the external controller, thereby efficiently presenting various tactile sensations in response to an operator pressing the push button 120.

In particular, the push switch 100 can present a tactile sensation to an operator by causing the push button 120 to vibrate in the front and rear direction as if the stroke amount of the push button 120 were large, although the stroke amount of the push button 120 (i.e., the bending amount of the elastic holding member 132) is significantly small. The push switch 100 can also present click feeling to an operator by causing the push button 120 to vibrate in front and rear direction, for example, as if there were a physical mechanism of presenting click feeling.

(Configuration of the Push Switch 100)

Figure 6:
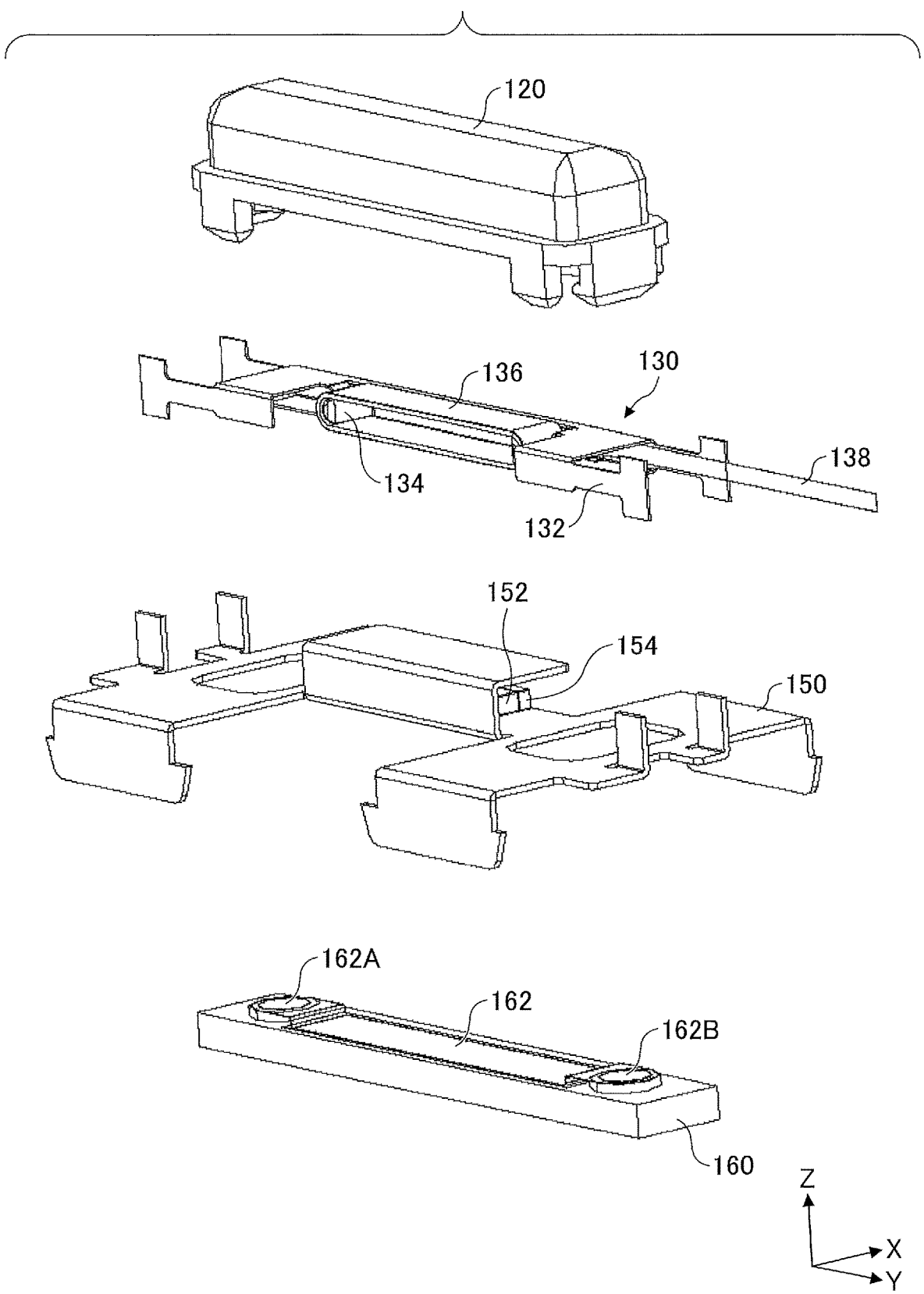
FIG. 6 is a perspective view of the disassembled push switch according to the embodiment.

FIG. 6 is a perspective view of the disassembled push switch 100 according to the embodiment. As illustrated in FIG. 6, the push switch 100 includes the push button 120, a vibration unit 130, a frame member 150, and a bracket 160 in order from above.

The push button 120 is an example of an "operating part". The push button 120 is a member that is pressed downward (i.e., in the negative Z-axis direction in the drawing). The push button 120 is attached to the top of the elastic holding member 132 provided by the vibration unit 130. The push button 120 has a rectangular shape of which the left and right direction (i.e., the Y-axis direction in the drawing) is the longitudinal direction in planar view from above. For example, the push button 120 is formed of a relatively rigid material such as a resin (e.g., an ABS resin), metal, or the like.

The vibration unit 130 holds the push button 120 configured to be pressed. Specifically, the vibration unit 130 includes the elastic holding member 132. The push button 120 is fixedly attached to the top of the elastic holding member 132. The first movable contact 131A and the second movable contact 131B are provided on a bottom surface of the elastic holding member 132. The elastic holding member 132 is bent downward by pressing the push button 120 downward, so that the first movable contact 131A and the second movable contact 131B can respectively contact the first fixed contact 162A and the second fixed contact 162B provided on the FPC 162. This causes the first fixed contact 162A and the second fixed contact 162B to be electrically coupled to each other via the elastic holding member 132. Thus, the push switch 100 is switched to the on state.

The vibration unit 130 can vibrate the push button 120 in the front and rear direction (i.e., in the X-axis direction in the drawing). Specifically, the vibration unit 130 includes the coil 136 wound around a bobbin 134. The coil 136 is held by the elastic holding member 132 such that the coil 136 can vibrate in the front and rear direction. Both ends of an electrical wire forming the coil 136 are connected to the FPC 138. The coil 136 is energized by the external controller through the FPC 138, so that the coil 136 vibrates in the front and rear direction while elastically deforming the elastic holding member 132. This causes the push button 120 attached to the top of the elastic holding member 132 to vibrate in the front and rear direction. Here, the details of the vibration unit 130 will be described later with reference to FIG. 8 and FIG. 9.

The frame member 150 is fixedly attached to the housing 110 and holds the elastic holding member 132 such that the elastic holding member 132 can vibrate in the front and rear direction. On the frame member 150, a permanent magnet 152 and a yoke 154 for vibrating the coil 136 provided in the elastic holding member 132. Here, the details of the frame member 150 will be described later with reference to FIG. 7.

The bracket 160 is a flat plate member provided under the frame member 150. The bracket 160 has a rectangular shape of which the left and right direction (i.e., the Y-axis direction in the drawing) is the longitudinal direction in planar view from above. For example, the bracket 160 is formed of a relatively rigid material, such as a resin, metal, or the like. The FPC 162 is provided on the upper surface of the bracket. The first fixed contact 162A and the second fixed contact 162B made of a metal film are formed on the surface of the FPC 162. The first fixed contact 162A is provided at a position facing the first movable contact 131A provided on the elastic holding member 132. The second fixed contact 162B is provided at a position facing the second movable contact 131B provided on the elastic holding member 132. When the push button 120 is pressed, the first fixed contact 162A contacts the first movable contact 131A and the second fixed contact 162B contacts the second movable contact 131B. This causes the first fixed contact 162A and the second fixed contact 162B to be electrically coupled to each other via the elastic holding member 132. The first fixed contact 162A and the second fixed contact 162B are connected to a device to be operated via wiring or the like. Thus, when the push button 120 is pressed, the first fixed contact 162A and the second fixed contact 162B are electrically coupled, thereby causing the device to be switched to the on state.

(Configuration of the Frame Member 150)

Figure 7:
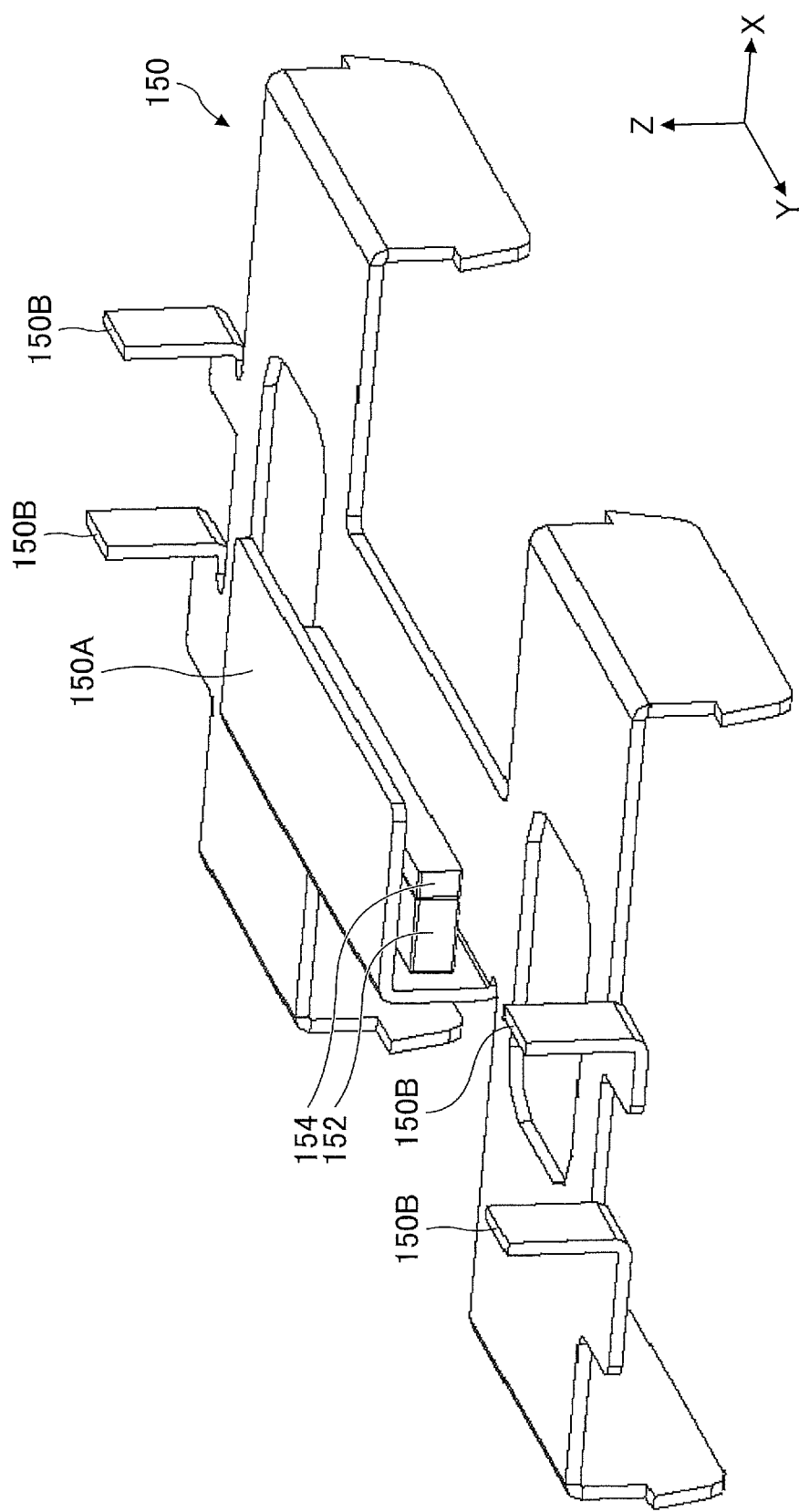
FIG. 7 is a perspective view of an external appearance of a frame member according to the embodiment.

FIG. 7 is a perspective view of an external appearance of the frame member 150 according to the embodiment. The frame member 150 is a member famed by processing a metal plate (e.g., cutting or folding). For example, the frame member 150 may be made of a conductive metal material (e.g., a stainless steel plate or a steel plate).

As illustrated in FIG. 7, the frame member 150 includes a covering 150A having a U-shaped cross-section. The covering 150A is formed by bending a metal plate. In the frame member 150, the permanent magnet 152 and the yoke 154 are arranged in the front and rear direction (i.e., in the X-axis direction in the drawing) in a space surrounded by the covering 150A. The permanent magnet 152 and the yoke 154 are prismatic members extending in the left and right direction (i.e., in the Y-axis direction in the drawing). One side surface of the permanent magnet 152 (i.e., a side surface on an X-axis negative side in the drawing) is adhered to a vertical wall forming the covering 150A. The other side of the permanent magnet 152 (i.e., a side surface on an X-axis positive side in the drawing) is adhered to a side surface of the yoke 154.

At both ends of the frame member 150 in the left and right direction (i.e., in the Y-axis direction in the drawing), holders 150B, which are vertical wall surfaces formed by bending the metal plate upward, are provided. The holder 150B holds a front end of the elastic arm 133 of the elastic holding member 132 (see FIGS. 8 to 10). The elastic holding member 132 includes the four elastic arms 133, and the frame member 150 includes four holders 150B for respectively holding the four elastic arms 133.

(Configuration of the Vibration Unit 130)

Figure 8:
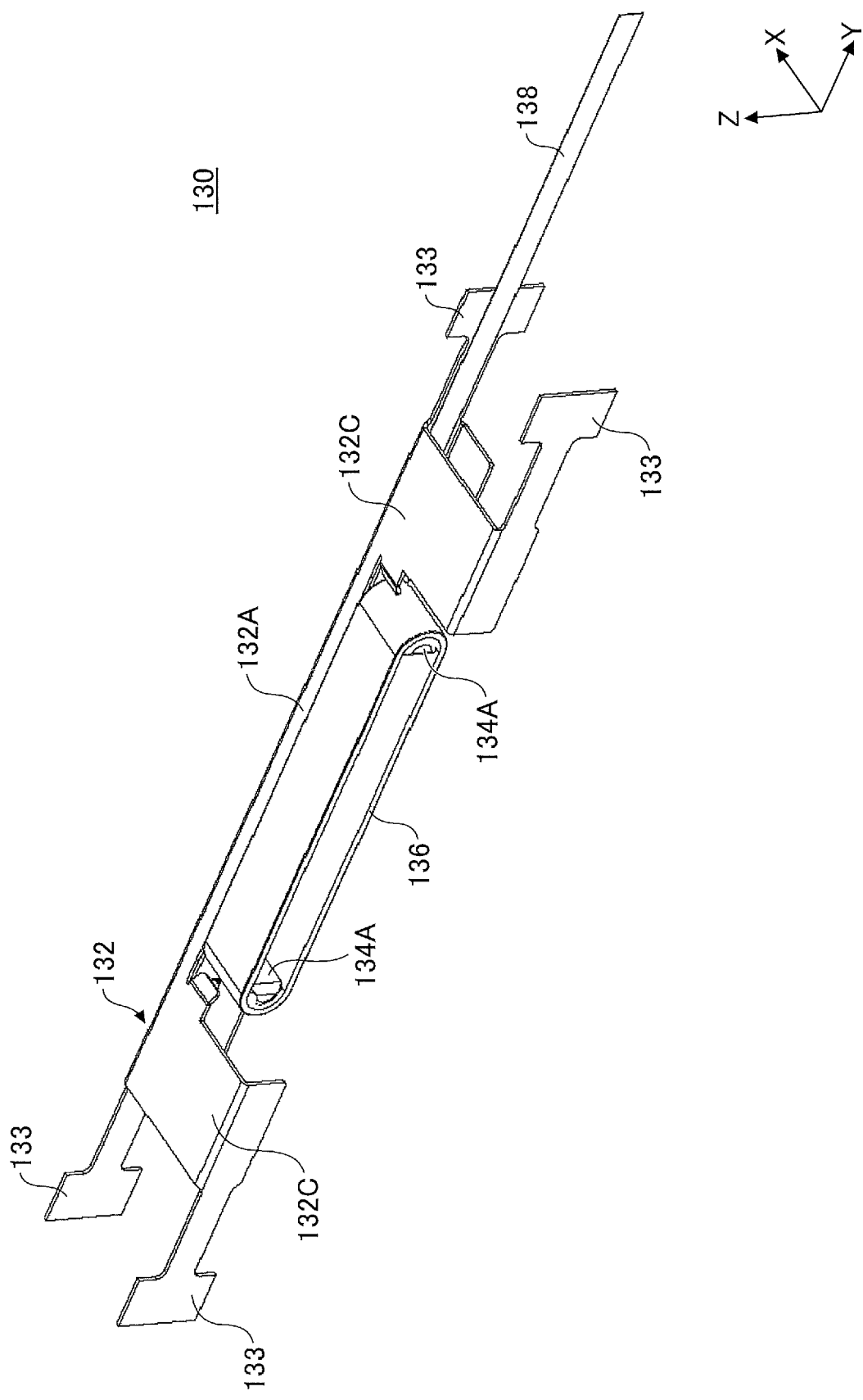
FIG. 8 is a perspective view of an external appearance of a vibration unit according to the embodiment.
Figure 9:
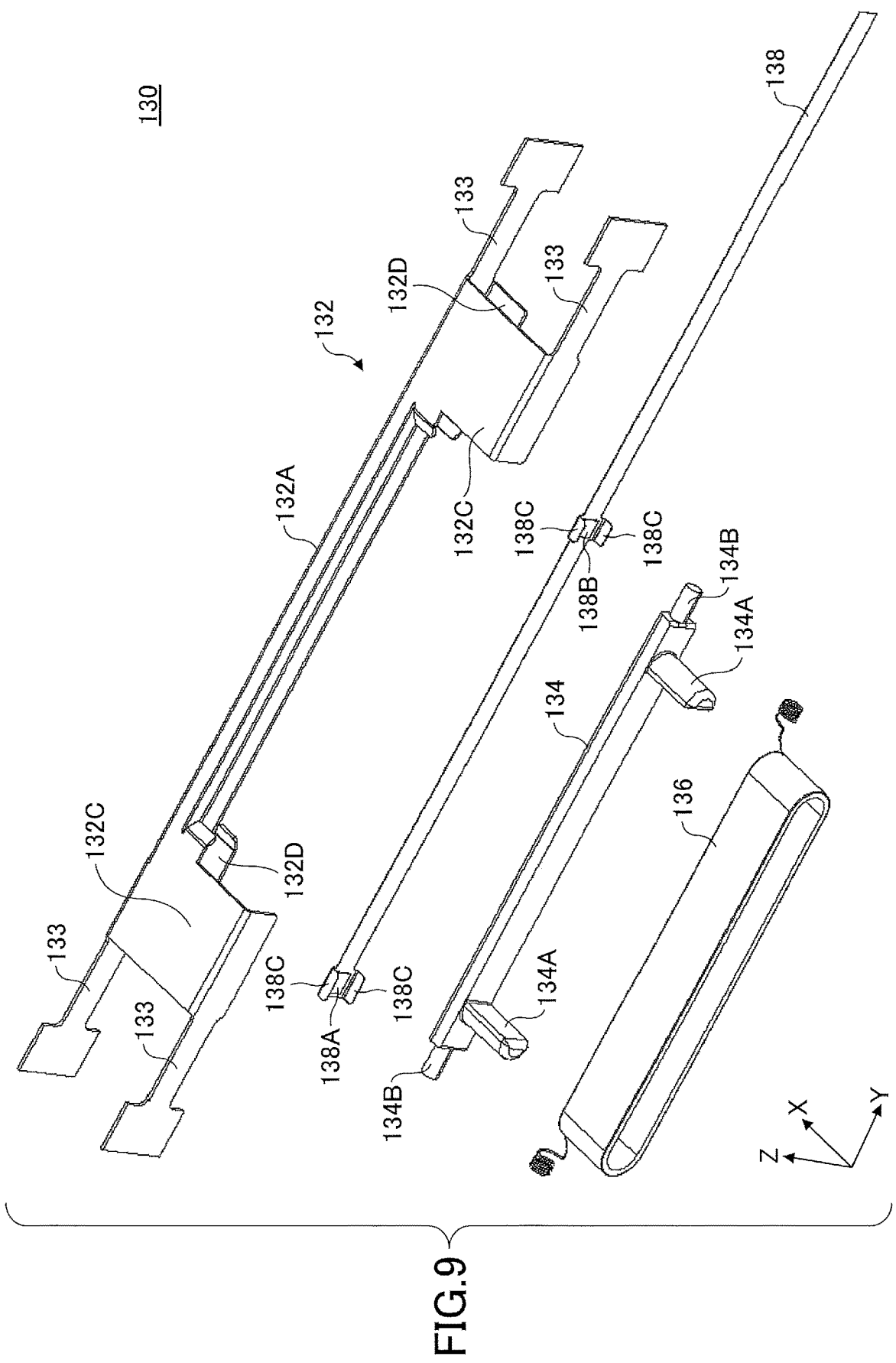
FIG. 9 is a perspective view of the disassembled vibration unit according to the embodiment.

FIG. 8 is a perspective view of an external appearance of the vibration unit 130 according to the embodiment. FIG. 9 is a perspective view of the disassembled vibration unit 130 according to the embodiment. As illustrated in FIG. 8 and FIG. 9, the vibration unit 130 includes the elastic holding member 132, the bobbin 134, the coil 136, and the FPC 138.

The elastic holding member 132 is a member formed by processing a metal plate (e.g., cutting and folding). For example, the frame member 150 may be made of a conductive metal material (e.g., a stainless steel plate and a steel plate).

The elastic holding member 132 includes a vibrator holder 132A, an elastic arm 133, a connector 132C, and a lower wall 132D.

The vibrator holder 132A is a portion that is a thin and long plate extending linearly in the left and right direction (i.e., in the Y-axis direction in the drawing). The vibrator holder 132A holds the bobbin 134 and the coil 136 by attaching the bobbin 134 to the inner surface of the vibrator holder 132A (i.e., the surface on the X-axis negative side in the drawing). Here, the vibrator holder 132A has a U-shaped cross-section to increase the strength of the vibrator holder 132A.

The elastic arm 133 is a portion that is a thin and long plate that extends linearly in the left and right direction (i.e., in the Y-axis direction in the drawing, an example of a "third direction" in the drawing) on each outer side of the vibrator holder 132A in the left and right direction (i.e., in the Y-axis direction in the drawing). The elastic arm 133 functions as what is called a leaf spring. A front end portion of the elastic arm 133 is fixed to the frame member 150, so that a portion other than the front end portion is elastically deformed in the front and rear direction (i.e., in the X-axis direction in the drawing). This enables the coil 136 held in the vibrator holder 132A to vibrate in the front end rear direction (i.e., in the X-axis direction in the drawing).

In the elastic holding member 132 according to the embodiment, two elastic arms 133 are provided parallel to each other on each outer side of the vibrator holder 132A in the left and right direction (i.e., the Y-axis direction in the drawing). Specifically, the elastic holding member 132 includes two pairs of elastic arms 133. The pair of elastic arms 133 is the elastic arm 133 extending from the vibrator holder 132A in the positive direction of the left and right direction (i.e., in the Y-axis positive direction in the drawing) and the elastic arm 133 extending from the vibrator holder 132A in the negative direction of the left and right direction (i.e., in the Y-axis negative direction in the drawing). The number of elastic arms 133 is not limited to this, but the elastic holding member 132 may include a pair of elastic arms 133, three pairs of elastic arms 133, or more.

The elastic arm 133 is relatively narrow in the up and down direction (i.e., the Z-axis direction in the drawing) and relatively long in the left and right direction (i.e., the Y-axis direction in the drawing), that is, the elastic arm 133 has a sufficient elastic effective length, so that the elastic arm 133 is very flexible in the front and rear direction (i.e., the X-axis direction in the drawing). This enables the push switch 100 according to the embodiment to sufficiently vibrate the coil 136 held in the vibrator holder 132A in the front and rear direction (in the X-axis direction in the drawing).

The connector 132C is a portion that is a flat plate connecting upper edges of the two elastic arms 133 parallel to each other. The lower wall 132D is a portion that is a flat plate parallel to the connector 132C. The lower wall 132D is connected to a lower edge of one elastic arm 133 of the two elastic arms 133 parallel to each other (i.e., the elastic arm 133 that is provided on the X-axis positive side in the drawing and that extends from the vibrator holder 132A).

The bobbin 134 is a thin and long rod member that extends linearly in the left and right direction (i.e., the Y-axis direction in the drawing). The bobbin 134 is attached to the inner surface (i.e., a surface on the X-axis negative side in the drawing) of the vibrator holder 132A. On the surface of the bobbin 134 (i.e., a surface facing the permanent magnet 152), the bobbin 134 includes a pair of columns 134A, and the columns 134A are arrayed in the left and right direction (i.e., the Y-axis direction in the drawing). The columns 134A are erected perpendicular to the surface of the bobbin 134. The bobbin 134 supports the coil 136 via the pair of columns 134A while the coil 136 is formed by winding an electrical wire across the pair of columns 134A. On each of one end face and the other end face of the bobbin 134 in the left and right direction (i.e., the Y-axis direction in the drawing), a column 134B (i.e., an example of a "first column" and a "second column") erected perpendicular to the end face is provided. The end of the electrical wire forming the coil 136 is wound around the column 134B. For example, the bobbin 134 may be formed using a relatively rigid material such as a resin (e.g., a liquid crystal polymer resin, a polyacetal resin, or a polyamide resin).

The coil 136 is formed by winding the electrical wire across the pair of columns 134A in the bobbin 134 multiple times. The electrical wire forming the coil 136 is preferably made of a material having relatively low electrical resistance such as a copper wire coated with an insulator. One end (i.e., a first end) of the electrical wire forming the coil 136 is connected to an electrode terminal 138A provided on the FPC 138 (i.e., an example of a "first electrode terminal") by soldering or the like while being wound around one column 134B of the bobbin 134. The other end (i.e., a second end) of the electrical wire forming the coil 136 is connected to the electrode terminal 138B provided on the FPC 138 (i.e., an example of a "second electrode terminal") by soldering or the like while being wound around the other column 134B of the bobbin 134. An alternating magnetic field is generated around the coil 136 by the coil 136 when an external controller supplies the alternating current through the FPC 138. This magnetizes one end and the other end of the coil 136 in the front and rear direction (i.e., the X-axis direction in the drawing) to different magnetic poles, and each of the one end and the other end is alternately magnetized to the N and S poles.

The FPC 138 is a band shaped and flexible wiring member. The FPC 138 connects the coil 136 to the external controller to supply the alternating current to the coil 136. The FPC 138 has a structure in which an electrical wire made of a metal film is sandwiched by insulating layers made of a resin material such as polyimides. On the FPC 138, two electrode terminals 138A and 138B made of a metal film are formed. The electrode terminal 138A is connected to one end of the electrical wire forming the coil 136 by soldering or the like. The electrode terminal 138B is connected to the other end of the electrical wire forming the coil 136 by soldering or the like. The FPC 138 includes an enlargement portion 138C that partially enlarges the width of the insulating layer where the electrode terminals 138A and 138B are famed. The enlargement portions 138C are bent at right angles toward a coil 136 side (i.e., the X-axis negative side in the drawing) to provide protective walls to protect an upper side (i.e., a Z-axis positive side in the drawing) and a lower side (i.e., a Z-axis negative side in the drawing) of each of the electrode terminals 138A and 138B. Thus, the enlargement portion 138C can prevent the occurrence of short circuits between the ends of the coil 136, which are soldered to the electrode terminals 138A and 138B and the elastic holding member 132 made of a metal material (i.e., the connector 132C and the lower wall 132D).

The FPC 138 is linearly disposed along the inner surface (i.e., the surface on the X-axis negative side in the drawing) of the vibrator holder 132A and is pulled out from the front end of the one elastic arm 133 to the outside of the elastic holding member 132. A portion of the FPC 138 is sandwiched between the vibrator holder 132A and the bobbin 134 by attaching the bobbin 134 to the vibrator holder 132A. This enables the FPC 138 to stably remain linearly disposed along the vibrator holder 132A without causing bending, folding, and interference to other members, or the like. The width of the FPC 138 in the up and down direction is narrower than the width of the vibrator holder 132A and the elastic arm 133 in the up and down direction. This enables the FPC 138 to be disposed along the vibrator holder 132A and the elastic arm 133 without protruding above or below the vibrator holder 132A and the elastic arm 133.

(Combination of the Frame Member 150 and the Vibration Unit 130)

Figure 10:
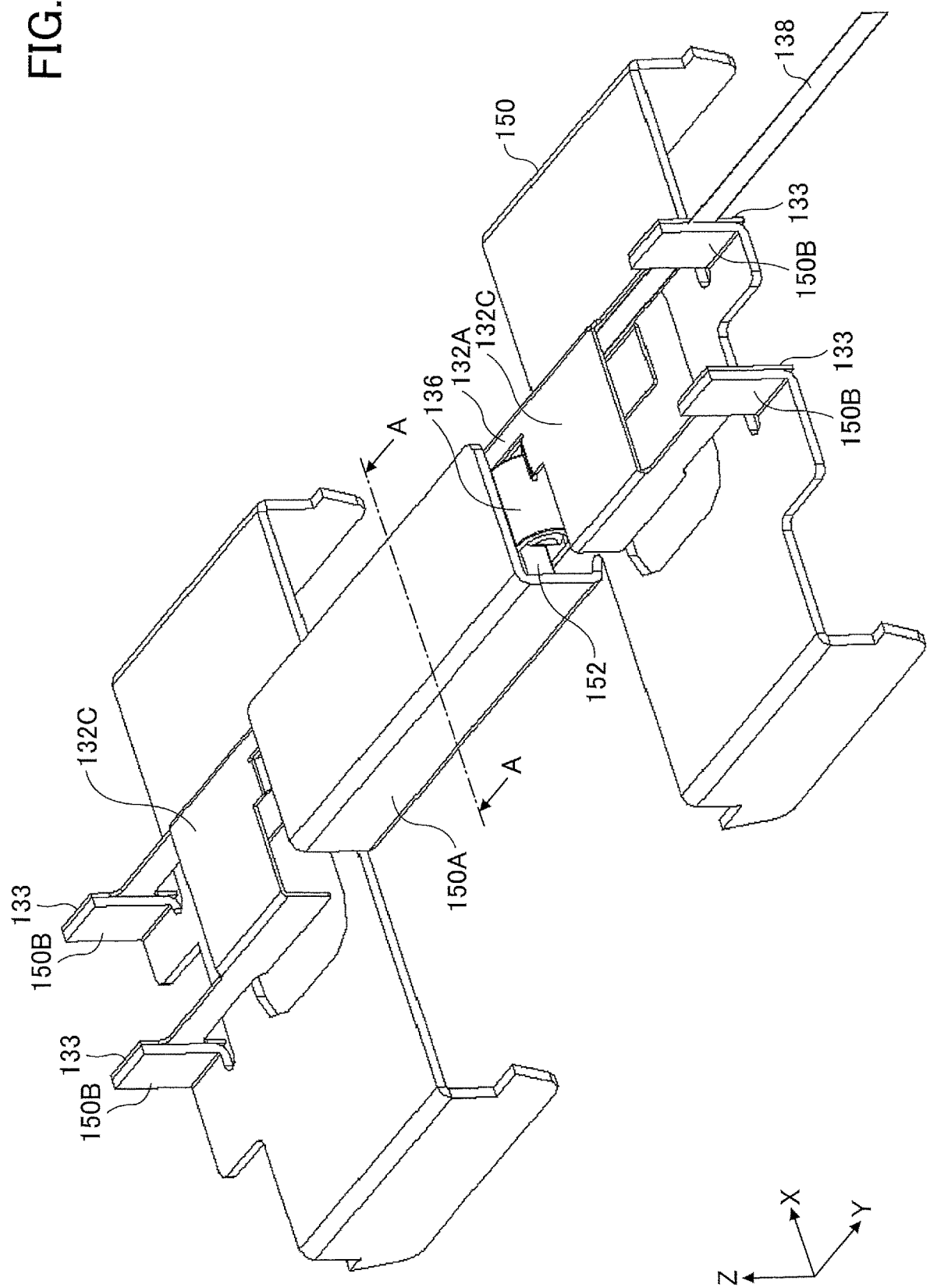
FIG. 10 is a perspective view of an external appearance of the frame member and the vibration unit according to the embodiment when combined together.
Figure 11:
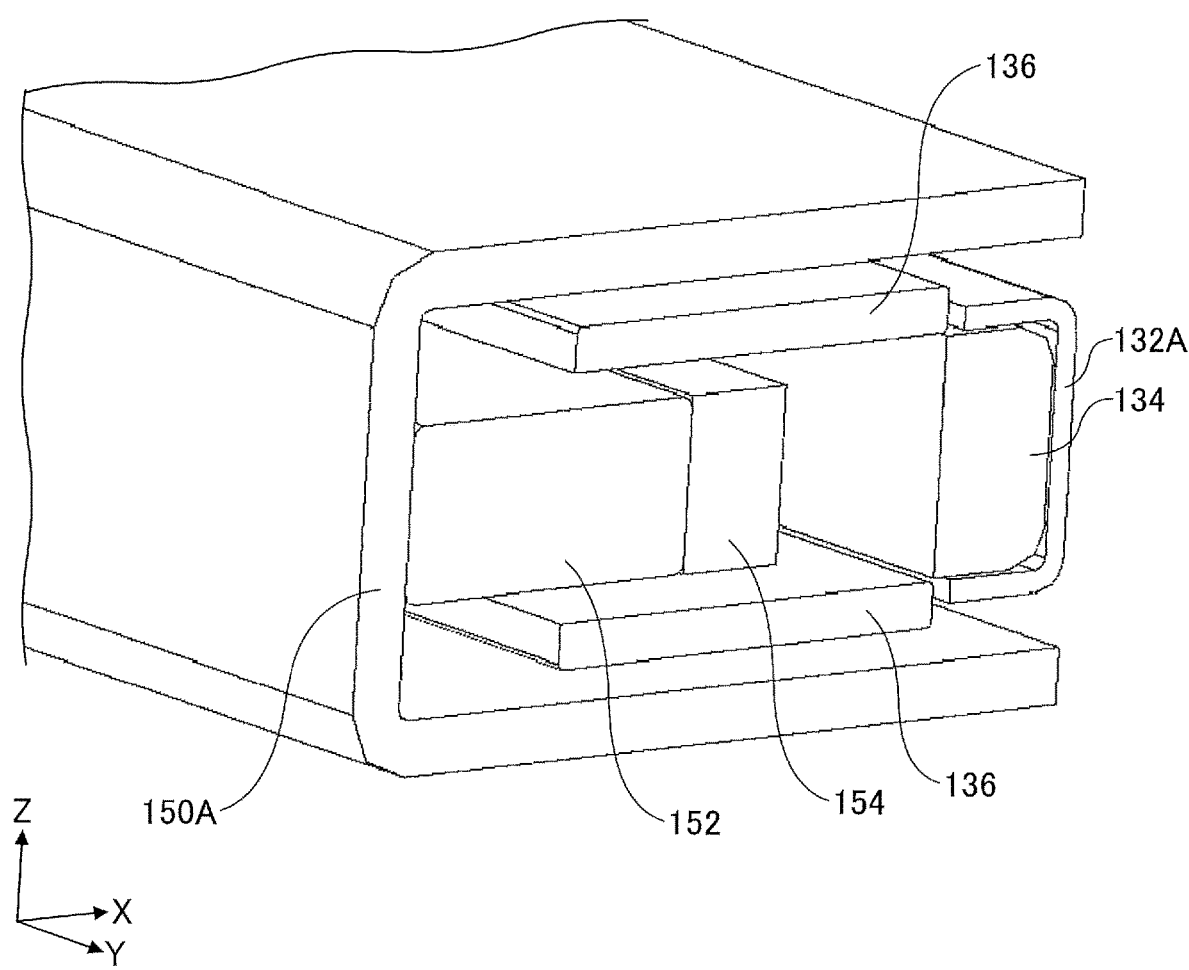
FIG. 11 is a cross-sectional view of the frame member and the vibration unit illustrated in FIG. 10 taken along the line A-A.

FIG. 10 is a perspective view of an external appearance of the frame member 150 and the vibration unit 130 according to the embodiment when combined together. FIG. 11 is a cross-sectional view of the frame member 150 and the vibration unit 130 illustrated in FIG. 10 taken along the line A-A.

As illustrated in FIG. 10, the front ends of the four elastic arms 133 of the elastic holding member 132 are respectively bonded to the four holders 150B provided in the frame member 150. Thus, the frame member 150 holds the elastic holding member 132 such that the elastic holding member 132 can vibrate in the front and rear direction (i.e., the X-axis direction in the drawing).

As illustrated in FIG. 11, the coil 136 held with the bobbin 134 by the vibrator holder 132A is disposed in a space surrounded by the covering 150A having a U-shaped cross-section in the frame member 150. This results in a state in which the upper side and the lower side of the coil 136 are respectively covered by the upper wall and the lower wall of the covering 150A.

The permanent magnet 152 and the yoke 154 (i.e., an example of a "first yoke") are provided side by side in the space surrounded by the covering 150A in the front and rear direction (i.e., in the X-axis direction in the drawing). By providing the coil 136 in the space surrounded by the covering 150A, the permanent magnet 152 and the yoke 154 are positioned in a space surrounded by the coil 136.

The covering 150A is magnetically coupled to the permanent magnet 152 to function as a "second yoke" covering the upper side and lower side of the coil 136. That is, the coil 136 is sandwiched between the yoke 154 (i.e. the first yoke) and the covering 150A (i.e., the second yoke). This enables the push switch 100 in the embodiment to generate a magnetic flux in the up and down direction between the first yoke (i.e., the yoke 154) provided inside the coil 136 and the second yoke (i.e., the covering 150A) provided outside the coil 136. By disposing the coil 136 so as to block the magnetic flux, magnetic efficiency between the permanent magnet 152 and the coil 136 can be increased.

(Operation of the Coil 136)

Figure 12A:
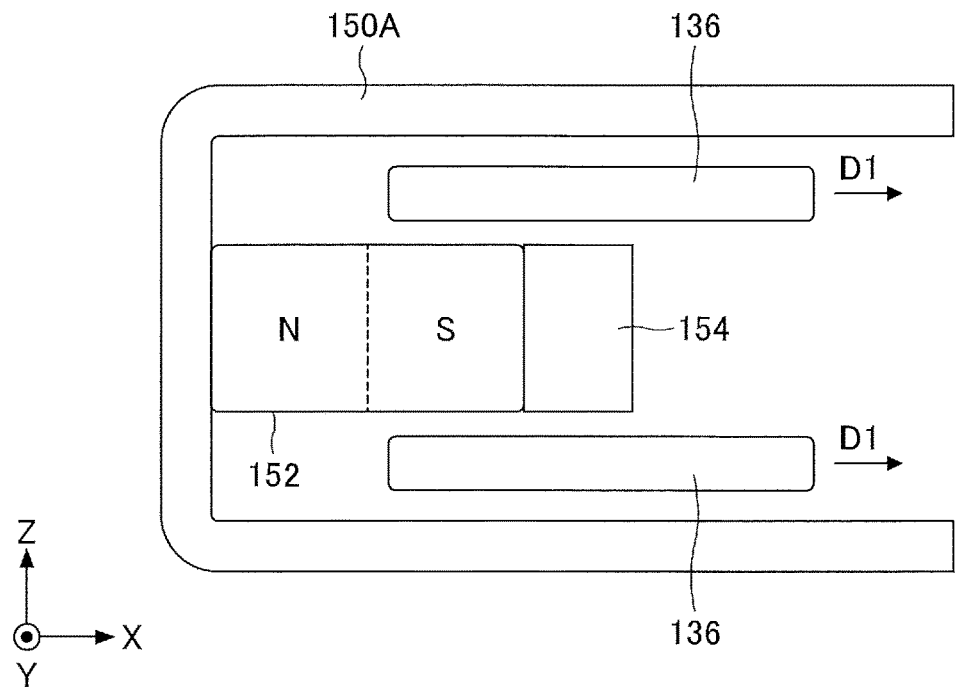
FIG. 12A is a drawing for describing an operation of a coil according to the embodiment.
Figure 12B:
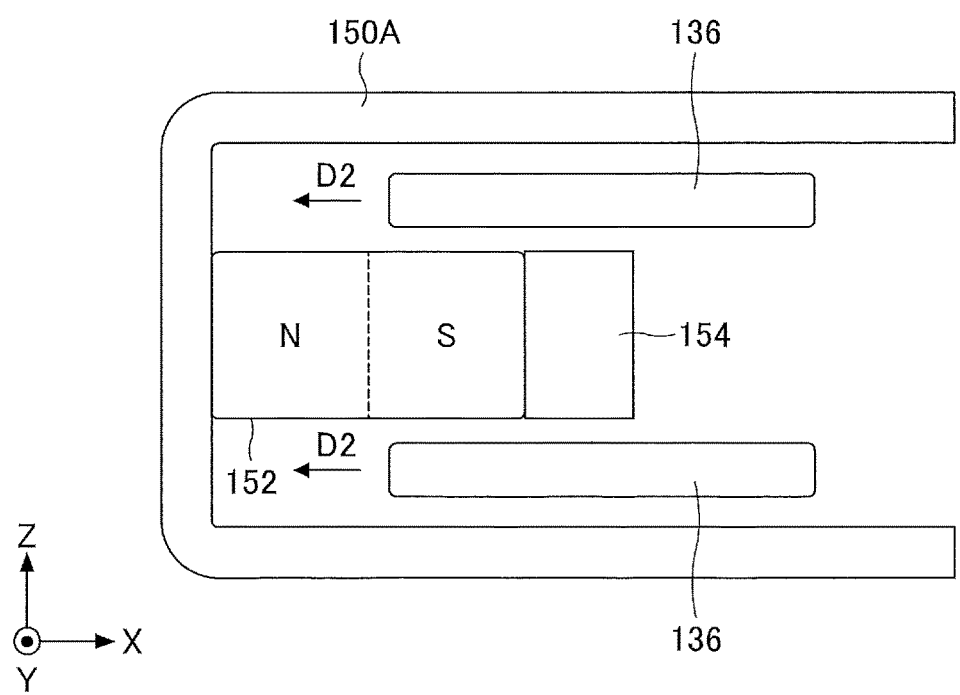
FIG. 12B is a drawing for describing an operation of the coil according to the embodiment.

FIG. 12A and FIG. 12B are drawings for describing an operation of the coil 136 according to the embodiment. In FIG. 12A and FIG. 12B, cross-sections of the coil 136, the permanent magnet 152, the yoke 154, and the covering 150A are schematically illustrated.

As illustrated in FIG. 12A and FIG. 12B, the permanent magnet 152 is magnetized in the front and rear direction (i.e., the X-axis direction in the drawing). In the example illustrated in FIG. 12A and FIG. 12B, an X-axis negative side of the permanent magnet 152 is magnetized to the N pole (i.e., an example of a "second magnetic pole"), and an X-axis positive side of the permanent magnet 152 is magnetized to the S pole (an example of a "first magnetic pole").

The push switch 100 according to the embodiment generates the alternating magnetic field around the coil 136 by flowing the alternating current through the coil 136, thereby generating the Lorentz force in the front and rear direction (i.e., the X-axis direction in the drawing).

For example, as illustrated in FIG. 12A, when the current flows through the coil 136 in one direction, the magnetic field formed by the permanent magnets 152 and each yoke generates the Lorentz force applied to the coil 136 toward the X-axis positive side by following Fleming's left-hand rule. Thus, the coil 136 moves in the X-axis positive direction (i.e., the arrow D1 direction in the drawing) while elastically deforming the elastic holding member 132.

With respect to the above, as illustrated in FIG. 12B, when the current flows through the coil 136 in the other direction, the magnetic field formed by the permanent magnet 152 and each yoke generates the Lorentz force applied to the coil 136 toward the X-axis negative side by following Fleming's left-hand rule. Thus, the coil 136 moves in the X-axis negative direction (i.e., the arrow D2 direction in the drawing) while elastically deforming the elastic holding member 132.

As described above, in the push switch 100 according to the embodiment, the movement direction of the coil 136 is determined in accordance with the direction in which the current flows through the coil 136. Thus, the push switch 100 according to the embodiment can cause the coil 136 to vibrate in the front and rear direction by supplying the alternating current to the coil 136 to alternately switch the movement direction of the coil 136.

Here, the coil 136 is supported by the elastic holding member 132 and vibrates along the front and rear direction (i.e., the X-axis direction in the drawing) at a first natural frequency. The first natural frequency is determined in accordance with an elastic modulus inherent in the elastic holding member 132, a quantity of the coil 136, and the like. That is, the push switch 100 according to the embodiment is configured to sufficiently vibrate the coil 136 in the front and rear direction (i.e., the X-axis direction in the drawing) by controlling the frequency of the alternating current supplied to the coil 136 from the external circuit and generating the alternating magnetic field in the coil 136 at the same frequency as the first natural frequency.

(Configuration of Each Component of the Push Switch 100)

Figure 14:
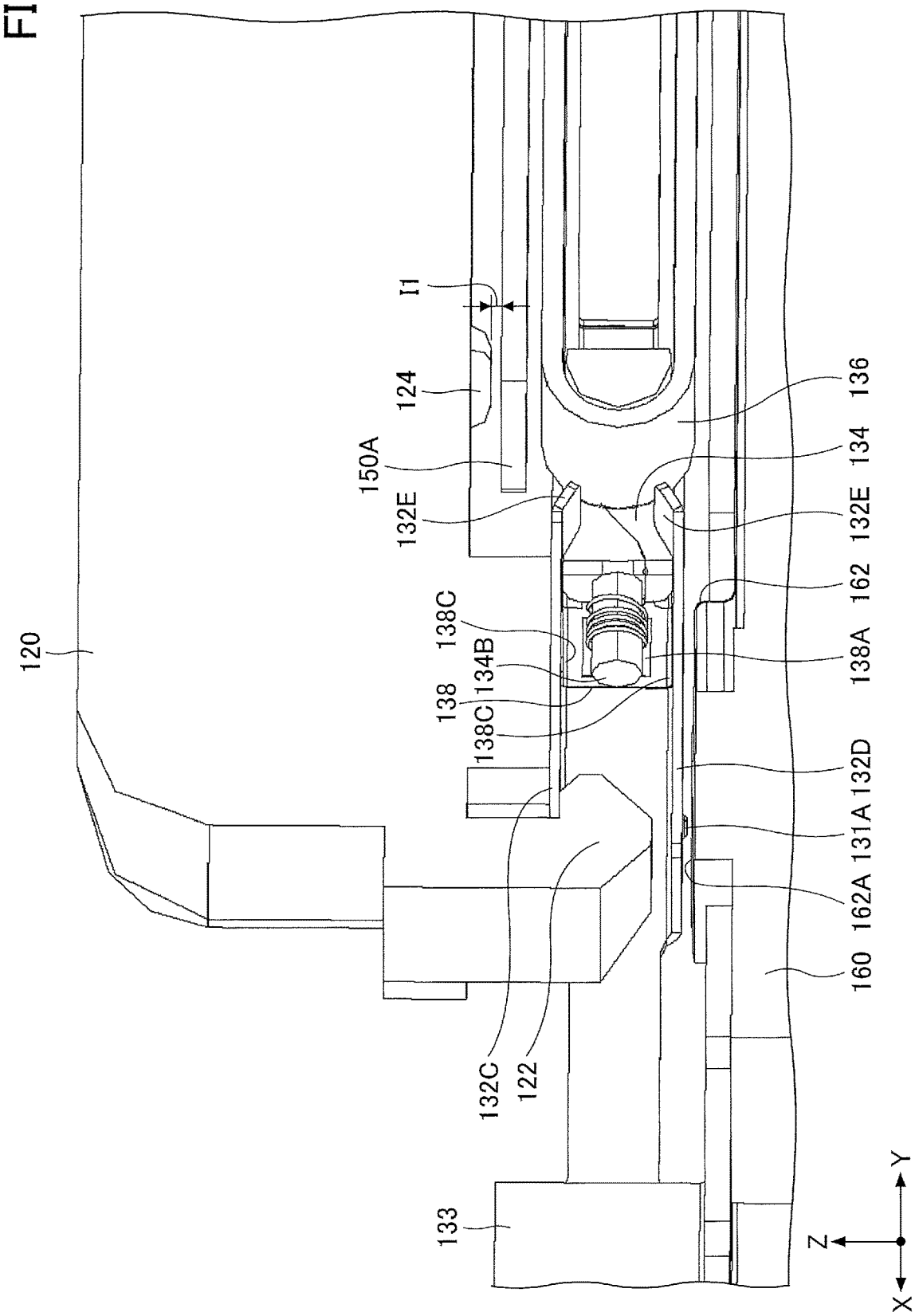
FIG. 14 is a partially enlarged view of the push switch illustrated in FIG. 13.

FIG. 13 is a cross-sectional view of the push switch 100 according to the embodiment taken along the YZ plane. FIG. 14 is a partially enlarged view of the push switch 100 illustrated in FIG. 13. Here, in FIG. 14, a proximity of one end (i.e., an end on the Y-axis negative side in the drawing) of the push button 120 in the push switch 100 is enlarged. However, since the push switch 100 has a symmetrical structure, a proximity of the other end (i.e., an end on the Y-axis positive side in the drawing) of the push button 120 has a similar configuration.

As illustrated in FIG. 13 and FIG. 14, in the push button 120, hooks 122 extending downward are provided on both ends in the left and right direction (i.e., the Y-axis direction in the drawing). The push button 120 is fixedly attached to the elastic holding member 132 by the two hooks 122 engaging respective edges of the two connectors 132C included in the elastic holding member 132.

As illustrated in FIG. 13, the elastic holding member 132 includes the connector 132C and the lower wall 132D that are parallel to each other on each outer side of the vibrator holder 132A in the left and right direction (i.e., the Y-axis direction in the drawing). On the bottom surface of one lower wall 132D (i.e., the lower wall 132D on the Y-axis negative side in the drawing), the first movable contact 131A protruding downward is provided. Similarly, on the bottom surface of the other lower wall 132D (i.e., the lower wall 132D on the Y-axis positive side in the drawing), the second movable contact 131B protruding downward is provided. The first movable contact 131A is provided at a position facing the first fixed contact 162A provided on the FPC 162. The second movable contact 131B is provided at a position facing the second fixed contact 162B provided on the FPC 162.

As illustrated in FIG. 14, the first movable contact 131A is separate from the first fixed contact 162A when the push button 120 is not pressed. Similarly, the second movable contact 131B is separate from the second fixed contact 162B. Therefore, the first fixed contact 162A and the second fixed contact 162B are not electrically coupled, that is, the push switch 100 is in the off state.

With respect to the above, when the push button 120 is pressed downward, pressing pressure from the push button 120 causes the elastic holding member 132 to bend downward. Thus, the first movable contact 131A comes in contact with the first fixed contact 162A and the second movable contact 131B comes in contact with the second fixed contact 162B. As a result, the first fixed contact 162A and the second fixed contact 162B are electrically coupled through the elastic holding member 132, that is, the push switch 100 is in the on state.

On the bottom surface of the push button 120, two protrusions 124 protruding downward are provided on a portion of the frame member 150 that faces the upper wall of the covering 150A. The protrusions 124 are an example of a "regulator" that regulates the bending amount of the elastic holding member 132. As illustrated in FIG. 14, the protrusion 124 has a constant space I1 between the protrusion 124 and the upper wall of the covering 150A when the push button 120 is not pressed. When the push button 120 is pressed downward, the protrusion 124 contacts the upper wall of the covering 150A to stop the downward movement of the push button 120. That is, the protrusion 124 limits the pushing amount of the push button 120 to the space I1. Thus, the protrusion 124 can prevent the push button 120 from being pushed downward more than necessary, and prevent the elastic holding member 132 from being excessively bent.

On both end surfaces of the bobbin 134 in the left and right direction (i.e., the Y-axis direction in the drawing), cylindrical columns 134B are provided. One column 134B (i.e., the column 134B on the Y-axis negative side in the drawing) is provided at a position facing the electrode terminal 138A provided in the FPC 138, and a portion the electrical wire forming the coil 136 at one end of the electrical wire is wound around the one column 134B. The other column 134B (i.e., the column 134B on the Y-axis positive side in the drawing) is provided at a position facing the electrode terminal 138B provided in the FPC 138, and a portion of the electrical wire forming the coil 136 at the other end of the electrical wire is wound around the other column 134B. This enables the two columns 134B to support both ends of the electrical wire forming the coil 136 and to increase contact areas of both ends with respect to the electrode terminals 138A and 138B, thereby increasing the bond strength of soldering at both ends.

In the FPC 138, the enlargement portion 138C that partially enlarges the width of the insulating layer of the FPC 138 is provided at a portion where each of the electrode terminals 138A and 138B is provided. The enlargement portion 138C protects the upper side and lower side of the column 134B so that a short circuit between the end of the electrical wire forming the coil 136 wound around the column 134B and the elastic holding member 132 made of a metal material (i.e., the connector 132C and the lower wall 132D) can be prevented.

The connector 132C and the lower wall 132D are provided with a pair of upper and lower hooks 132E protruding toward the coil 136 side. The pair of hooks 132E is bent inward to narrow a space between the pair of hooks 132E and fracture surfaces of the pair of hooks are in contact with a surface of the bobbin 134, thereby fixing the bobbin 134 to the vibrator holder 132A.

Figure 15:
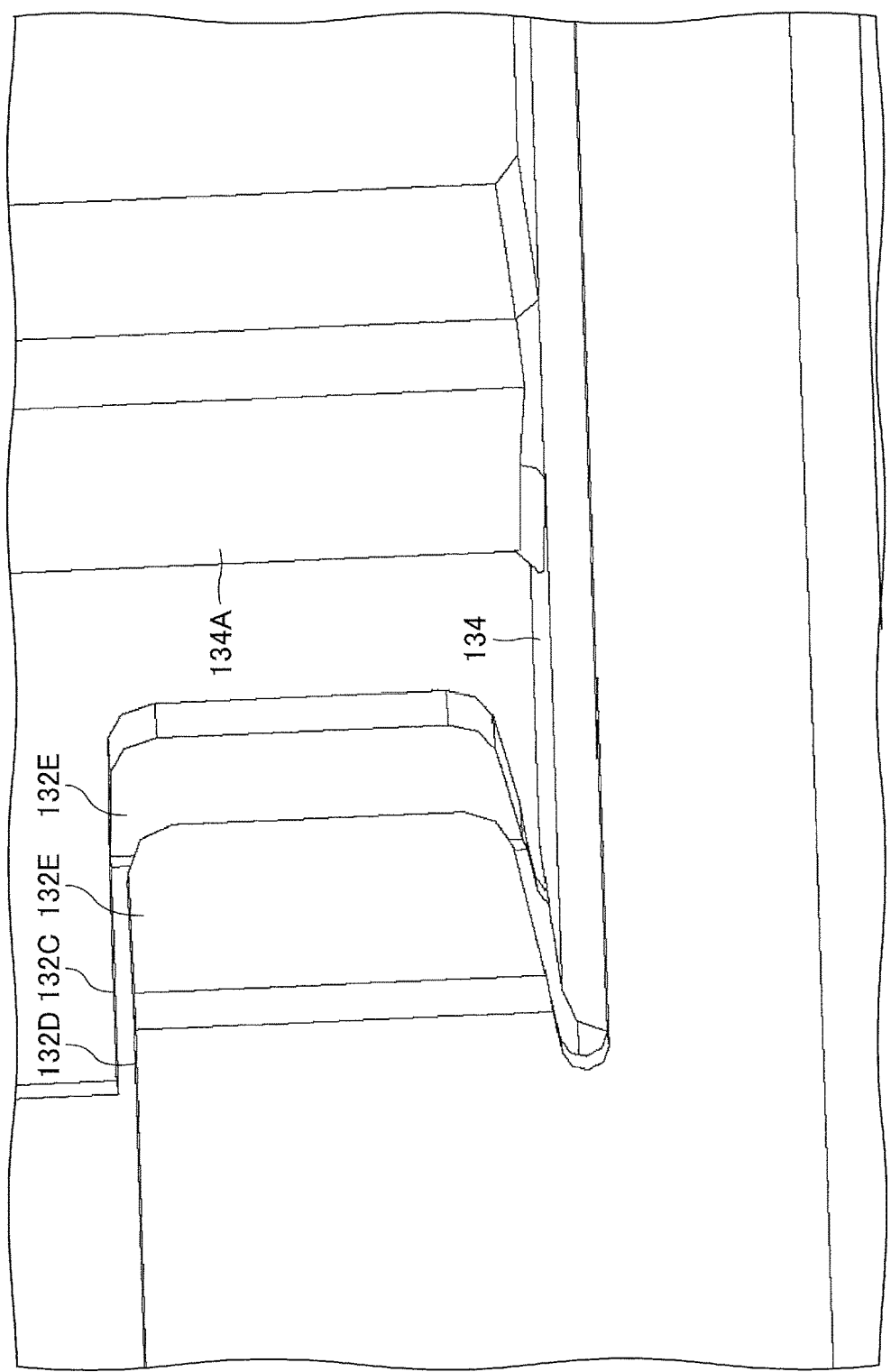
FIG. 15 is a partially enlarged view illustrating a structure in which a bobbin is fixed by a pair of hooks in the push switch according to the embodiment.

FIG. 15 is a partially enlarged view illustrating a structure in which the bobbin 134 is fixed by the pair of hooks 132E in the push switch 100 according to the embodiment. As illustrated in FIG. 15, each fracture surface of the pair of hooks 132E (i.e., the fracture surface facing a side surface of the bobbin 134) is tilted relative to the surface of the bobbin 134 so that the separation amount from the surface of the bobbin 134 gradually increases toward a front end of the pair of hooks 132E. Thus, each of the pair of hooks 132E can adjust a contact position with the surface of the bobbin 134 by adjusting the inward bending amount. That is, the pair of hooks 132E can fix the bobbin 134 at a contact position in accordance with the actual manufacture dimensions of the bobbin 134 by adjusting the inward bending amount, even when individual differences exist in the manufacture dimensions of the bobbin 134.

As described above, the push switch 100 according to the present embodiment includes a push button 120 that is pressed downward, an elastic holding member 132 that holds the push button 120 such that the push button 120 can vibrate in the front and rear direction, a frame member 150 that holds the elastic holding member 132 such that the elastic holding member 132 can vibrate in the front and rear direction, and the coil 136 that is provided on the elastic holding member 132 and that generates a vibration in the front and rear direction. Thus, the push switch 100 according to the present embodiment can vibrate the push button 120 in the front and rear direction together with the coil 136 by causing the coil 136 to generate the vibration. The push switch 100 according to the embodiment can produce various vibrations in the push button 120 by controlling the current supplied to the coil 136. Therefore, the push switch 100 according to the present embodiment is able to efficiently present various tactile sensations to an operator pressing the push button 120 with a relatively simple configuration.

The embodiment of the invention has been described in detail above, but the invention is not limited to the embodiment. Various modifications or alterations can be made within the scope of the invention as recited in the claims.

For example, in the embodiment described above, the permanent magnet 152 is provided in the frame member 150 and the coil 136 is provided as a "vibrator" in the elastic holding member 132, the invention is not limited to this. For example, the coil 136 may be provided in the frame member 150, and the permanent magnet 152 may be provided as a "vibrator" in the elastic holding member 132.

What is claimed is:

1. A push switch comprising:
   an operating part configured to be pressed in a first direction;
   an elastic holding member configured to hold the operating part such that the operating part can vibrate in a second direction orthogonal to the first direction;
   a frame member configured to hold the elastic holding member such that the elastic holding member can vibrate in the second direction;
   a vibrator configured to generate a vibration in the second direction, the vibrator being provided in the elastic holding member;
   a permanent magnet fixedly provided in the frame member; and
   wherein the vibrator includes a coil that generates the vibration in the second direction by forming a magnetic field between the coil and the permanent magnet when a current is supplied to the coil,
   wherein the permanent magnet is provided in a space surrounded by the coil, and
   wherein the push switch further comprises a yoke that is magnetically coupled to a magnetic pole of the permanent magnet and that is provided so as to cover an outer surface of the coil, and another yoke that is magnetically coupled to another magnetic pole of the permanent magnet and that is provided in the space surrounded by the coil.

2. The push switch as claimed in claim 1, wherein the yoke is seamlessly formed in the frame member.

3. The push switch as claimed in claim 1, further comprising:
   a bobbin that supports the coil, the bobbin being a thin and long rod; and
   a wiring member that is connected to an electrical wire forming the coil, the wiring member being a band shape,
   wherein the elastic holding member includes an attachment surface to which the bobbin is attached, and
   wherein the wiring member is laid along a longitudinal direction of the bobbin and is sandwiched between the bobbin and the attachment surface.

4. The push switch as claimed in claim 3,
   wherein the bobbin includes
   a first column that is provided on one end side of the longitudinal direction, a portion of the electrical wire at a first end of the electrical wire being wound around the first column; and
   a second column that is provided on another end side of the longitudinal direction, a portion of the electrical wire at a second end of the electrical wire being wound around the second column,
   wherein the wiring member includes
   a first electrode terminal that is provided at a position facing the first column and that is connected to the first end of the electrical wire, and
   a second electrode terminal that is provided at a position facing the second column and that is connected to the second end of the electrical wire.

5. The push switch as claimed in claim 4,
   wherein the wiring member includes an enlargement portion at each of a portion including the first electrode terminal and a portion including the second electrode terminal, the enlargement portion partially enlarging a band width of the wiring member.

6. The push switch as claimed in claim 3,
   wherein the elastic holding member includes a hook that can fix the bobbin by pressing a surface of the bobbin toward the attachment surface with a fracture surface facing the surface of the bobbin, wherein the hook can be bent in a horizontal direction with respect to the surface of the bobbin, and wherein the fracture surface is tilted with respect to the surface of the bobbin and a height of a position contacting the surface of the bobbin can be changed in accordance with a bending amount of the hook.

7. The push switch as claimed in claim 1,
wherein the elastic holding member includes
a vibrator holder that holds the vibrator, and
a pair of elastic arms that extends along a third direction in each of a positive direction and a negative direction of the third direction from the vibrator holder, a front end of each of the pair of elastic arms being fixed to the frame member, and the third direction being orthogonal to the first direction and the second direction.

8. The push switch as claimed in claim 7, wherein the elastic holding member includes a plurality of said pairs of elastic arms.

9. The push switch as claimed in claim 1, further comprising:
a movable contact that can be moved in the first direction in response to the elastic holding member being bent in the first direction when the operating part is pressed, the movable contact being provided on a bottom surface of the elastic holding member; and
a fixed contact that is caused to contact the movable contact in response to the movable contact being moved in the first direction, the fixed contact being provided at a position facing the movable contact.

10. The push switch as claimed in claim 9, wherein the operating part includes a regulator that regulates a bending amount of the elastic holding member in the first direction by contacting the frame member when the operating part is pressed, the regulator being provided to protrude in the first direction.

* * * * *